US007367115B2

(12) United States Patent
Nakai et al.

(10) Patent No.: US 7,367,115 B2
(45) Date of Patent: May 6, 2008

(54) COMPONENT MOUNTING APPARATUS

(75) Inventors: Nobuhiro Nakai, Kurume (JP); Hiroshi Ota, Tosu (JP); Kensuke Kawasumi, Neyagawa (JP); Hirotsugu Uemori, Moriguchi (JP); Kimio Iizuka, Tosu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 448 days.

(21) Appl. No.: 10/528,816

(22) PCT Filed: Dec. 4, 2003

(86) PCT No.: PCT/JP03/15570

§ 371 (c)(1),
(2), (4) Date: Mar. 23, 2005

(87) PCT Pub. No.: WO2004/071148

PCT Pub. Date: Aug. 19, 2004

(65) Prior Publication Data

US 2006/0042075 A1    Mar. 2, 2006

(30) Foreign Application Priority Data

Feb. 6, 2003    (JP) .............................. 2003-028939

(51) Int. Cl.
*H05K 3/30* (2006.01)
(52) U.S. Cl. .................... 29/740; 29/742; 29/743; 29/759; 29/834; 29/33 M; 198/817
(58) Field of Classification Search .......... 29/740–743, 29/759–762, 834, DIG. 44, 33 M; 414/737, 414/751.1, 752.1; 901/40; 269/903; 198/465.1, 198/817, 861.1

See application file for complete search history.

(56) References Cited

U.S. PATENT DOCUMENTS 5,839,187 A * 11/1998 Sato et al. .................... 29/743

(Continued)

FOREIGN PATENT DOCUMENTS

JP    64-050711    2/1989

(Continued)

OTHER PUBLICATIONS

English Language Abstract of JP 2858453.

(Continued)

*Primary Examiner*—Minh Trinh
(74) *Attorney, Agent, or Firm*—Greenblum & Bernstein, P.L.C.

(57) ABSTRACT

A component mounting apparatus having a work conveyor-positioner unit is arranged on a supporting base to convey and position a substrate in an X direction. Supporting frames extend vertically from ends of the supporting base and face each other in a Y direction. The component mounting apparatus further includes a plurality of Y-axis tables extending between upper ends of the supporting frames, X-axis tables attached to movable portions of the Y-axis tables, and operating heads attached to movable portions of the X-axis tables to perform operations with respect to the substrate on the work conveyor-positioner unit. Each of the plurality of the Y-axis tables includes a movable portion at a lower part. Each of the X-axis tables includes a movable portion at a lower part and the operating heads are attached to a lower part of the movable portion of the X-axis tables.

6 Claims, 7 Drawing Sheets

U.S. PATENT DOCUMENTS

| | | | |
|---|---|---|---|
| 5,860,208 A * | 1/1999 | Nomura | 29/740 |
| 5,862,586 A | 1/1999 | Kimura | |
| 6,370,750 B1 | 4/2002 | Matsumura et al. | |
| 6,513,233 B1 | 2/2003 | Nakao et al. | |
| 6,691,400 B1 * | 2/2004 | Negishi et al. | 29/740 |
| 6,920,687 B2 * | 7/2005 | Nakano et al. | 29/832 |
| 7,096,572 B2 * | 8/2006 | Aigner et al. | 29/740 |

FOREIGN PATENT DOCUMENTS

| | | |
|---|---|---|
| JP | 04-125996 | 4/1992 |
| JP | 09-321488 | 12/1997 |
| JP | 2858453 | 12/1998 |

OTHER PUBLICATIONS

English Language Abstract of JP 09-321488.
English Language Abstract of JP 64-050711.
English Language Abstract of JP 04-125996.

* cited by examiner

COMPONENT MOUNTING APPARATUS

TECHNICAL FIELD

The present invention relates to a component mounting apparatus configured to mount components such as electronic components on a work such as a substrate and to perform various operations with respect to the work in conjunction therewith. More specifically, the present invention relates to a component mounting apparatus configured to perform operations while moving an operating head such as a mounting head independently in an X direction and a Y direction.

BACKGROUND ART

Conventionally, there is widely and generally known an XY-robot component mounting apparatus configured to move a mounting head independently in an X direction and a Y direction, which includes a substrate conveyor-positioner unit to be arranged on a supporting base for conveying and positioning a substrate in an X direction (a right-to-left direction), supporting frames arranged in a standing manner on both ends in the X direction of this supporting base so as to straddle the substrate conveyor-positioner unit, Y-axis tables arranged in a Y direction (a back-to-front direction) on the both supporting frames, X-axis tables laid between movable portions arranged on upper or lower surfaces of the both Y-axis tables, a mounting head arranged on a movable portion provided on a front face of the X-axis table, and a component supplying unit or component supplying units arranged on any of a front part, a rear part, and both parts of the supporting base.

Meanwhile, there are also disclosed a component mounting apparatus including a plurality of nozzles provided on the mounting head for holding components by suction, and a component mounting apparatus provided with a plurality of mounting heads on the X-axis table so as to allow the respective mounting heads to mount components on corresponding substrates severally.

Various component mounting apparatuses of the above-described configurations are already well known (Japanese Patent No. 2858453, for example).

However, a typical XY-robot component mounting apparatus as described above is configured to repeat operations of holding a component by suction at the component supplying unit with the mounting head, then moving the mounting head in the X and Y directions and thereby positioning the mounting head in a position for mounting the component on the substrate, then mounting the component on the substrate with the mounting head, and then moving the mounting head back to the component supplying unit for holding another component to be mounted subsequently. Accordingly, an operation sequence required for mounting one component takes a long time. Therefore, in order to mount numerous components efficiently on a substrate, it is necessary to configure a mount line by arranging numerous component mounting apparatuses in the direction of conveying the substrate. In addition, the supporting frames for supporting the Y-axis tables are arranged on the both ends in the X direction and the mounting heads are configured to move inside the supporting frames in the X direction, resulting in enlargement of the component mounting apparatus in the X direction. Therefore, the mount line becomes extremely large and thereby develops problems of increases in equipment costs and high mounting costs.

Meanwhile, a regular type of component mounting apparatus configured to arrange an X-axis robot on a Y-axis robot develops a problem that the substrate size and the number of arrangement of component supplying means are limited if a width dimension in the X direction is set constant because of a restriction of a space for disposing the Y-axis robot and a restriction of a movable range for a mounting head on the X-axis robot. On the other hand, in order to secure the substrate size and the number of arrangement of component supplying means, the width in the X direction of the device is increased so that the device fails to achieve compact mounting equipment by reducing the width dimension of the device.

Meanwhile, when the plurality of nozzles are provided on the mounting head, it is possible to reduce operating time per component to some extent because it is possible to reduce the number of times that the mounting head moves between the component supplying unit and the substrate. However, since such reduction in operating time has a limitation, there is a demand for a component mounting apparatus which can achieve further enhancement in mounting efficiency and reduction in equipment costs.

Meanwhile, in the configuration of attaching the plurality of mounting heads to the X-axis table as well, an operation of holding components and a mounting operation still involve serial operations of the respective mounting heads. Although the operation efficiency may be improved to some extent as some of the operations can be carried out simultaneously, this component mounting apparatus is basically configured to perform the same mounting operation as the case of increasing the numbers of the nozzles. Therefore, the component mounting apparatus has a limitation of efficiency in the mounting operation, and also develops a problem that it is difficult to ensure mounting accuracy when the plurality of mounting heads are provided.

In view of the foregoing problems, it is an object of the present invention to provide a component mounting apparatus which is capable of performing operations efficiently and accurately while achieving a compact configuration.

DISCLOSURE OF THE INVENTION

A component mounting apparatus of the present invention is configured to arrange a work conveyor-positioner unit on a supporting base to convey and position a work in an X direction, to arrange supporting frames in a standing manner on both ends of the supporting base in a Y direction being orthogonal to the X direction, to lay a plurality of Y-axis tables between upper ends of the both supporting frames at an appropriate interval, to attach X-axis tables to movable portions of the respective Y-axis tables, to attach operating heads to movable portions of the X-axis tables to perform operations with respect to the work on the work conveyor-positioner unit, and to locate upper ends of the supporting frames below eyes of a worker.

In this configuration, it is possible to enhance the operation efficiency dramatically by using a plurality of operating heads while allowing the respective operating heads to perform operations independently. Moreover, it is possible to ensure operating accuracy because the respective operating heads are mutually insensitive to vibrations and the like associated with the operations thereof. In addition, while the component mounting apparatus includes the plurality of operating heads, the Y-axis tables are arranged in parallel to the X direction along the direction of conveying the work and are laid between the supporting frames arranged in a standing manner on the both ends in the Y direction of the supporting base. Accordingly, it is possible to relatively reduce an outside dimension in the X direction of the component mounting apparatus to achieve a compact configuration. It is also possible to dramatically reduce equipment costs for a work line. Moreover, since the upper ends of the supporting frames are located lower than the height of eyes of a worker, it is possible to visually confirm operating conditions of the operating heads on the both sides from above through the interval between the Y-axis tables. Accordingly, it is possible to confirm the operating conditions easily and workability during maintenance and checkups is thereby enhanced. In addition, since the overall height dimension is set below the height of eyes of a worker, rigidity is enhanced in accordance with reduction in the height dimensions of the supporting base and the supporting frames. In this way, it is possible to enhance mounting accuracy.

Meanwhile, when the Y-axis table includes a movable portion at a lower part thereof while the X-axis table includes a movable portion at a lower part thereof and the operating head is attached to a lower part of the movable portion of the X-axis table, the operating head is supported in a suspended style from the Y-axis table and the X-axis table. Accordingly, it is possible to achieve a compact configuration while gaining high support rigidity of the operating head.

Meanwhile, when a central portion of the X-axis table is attached to the movable portion of the Y-axis table while the interval for arranging the Y-axis tables is set slightly longer than a length of the X-axis table, the X-axis table is supported at the central portion and it is thereby possible to increase the supporting rigidity when the operating head moves between both ends thereof and to secure a sufficient space for visual confirmation between the Y-axis tables while achieving a compact dimension in the X direction of the component mounting apparatus.

Meanwhile, when the X-axis table includes guide portions provided on both sides thereof to movably support the movable portion arranged at the lower part thereof, and a linear motor provided on an upper side of a traveling path of the movable portion and between the guide portions on the both sides to drive and position the movable portion, it is possible to reduce a vertical dimension of the X-axis table by use of the linear motor having a small vertical dimension which is easily feasible. Accordingly, it is possible to raise an operating height of the operating head as high as possible while lowering the height of the upper ends of the supporting frames. In this way, it is possible to ensure high workability.

Meanwhile, when a component supplying unit is arranged on one side or both sides in the Y direction on the supporting base while the operating head includes an elevating mechanism in a position immediately below the movable portion, and when a nozzle unit having a plurality of nozzles for attaching components at the component supplying unit by suction is disposed beside the elevating mechanism, it is possible to reduce a vertical dimension of the operating head in itself for attaching by suction and thereby mounting the component. Accordingly, it is possible to raise a height of a mounting operation by the operating head as high as possible while lowering the height of the upper ends of the supporting frames. Moreover, since the nozzle unit includes the plurality of nozzles, it is possible to ensure high workability.

Meanwhile, when the plurality of nozzles are arranged to be capable of performing attachment by suction simultaneously at the component supplying unit, it is possible to hold a plurality of components in one cycle of moving the operating head to the component supplying unit and elevating the nozzle unit. Accordingly, it is possible to enhance the mounting efficiency.

Meanwhile, when the nozzle unit includes a selection mechanism for selectively transmitting the elevating operation of the elevating mechanism to a desired nozzle, it is possible to operate the desired nozzle simply by elevating the selection mechanism with the elevating mechanism. In this way, it is possible to perform operations of holding and mounting necessary components efficiently with a basic and simple configuration.

BRIEF DESCRIPTION OF THE DRAWINGS

FIG. 4A and FIG. 4B show a Y-axis table of the component mounting apparatus according to an embodiment of the present invention, in which FIG. 4A is an overall perspective view and FIG. 4B is a perspective view with a cross section taken along the IVB-IVB line in FIG. 4A;

BEST MODE FOR CARRYING OUT THE INVENTION

Now, an embodiment of applying a component mounting apparatus of the present invention to a component mounting apparatus for mounting electronic components on a substrate will be described with reference to FIG. 1 to FIG. 7.

Figure 1:
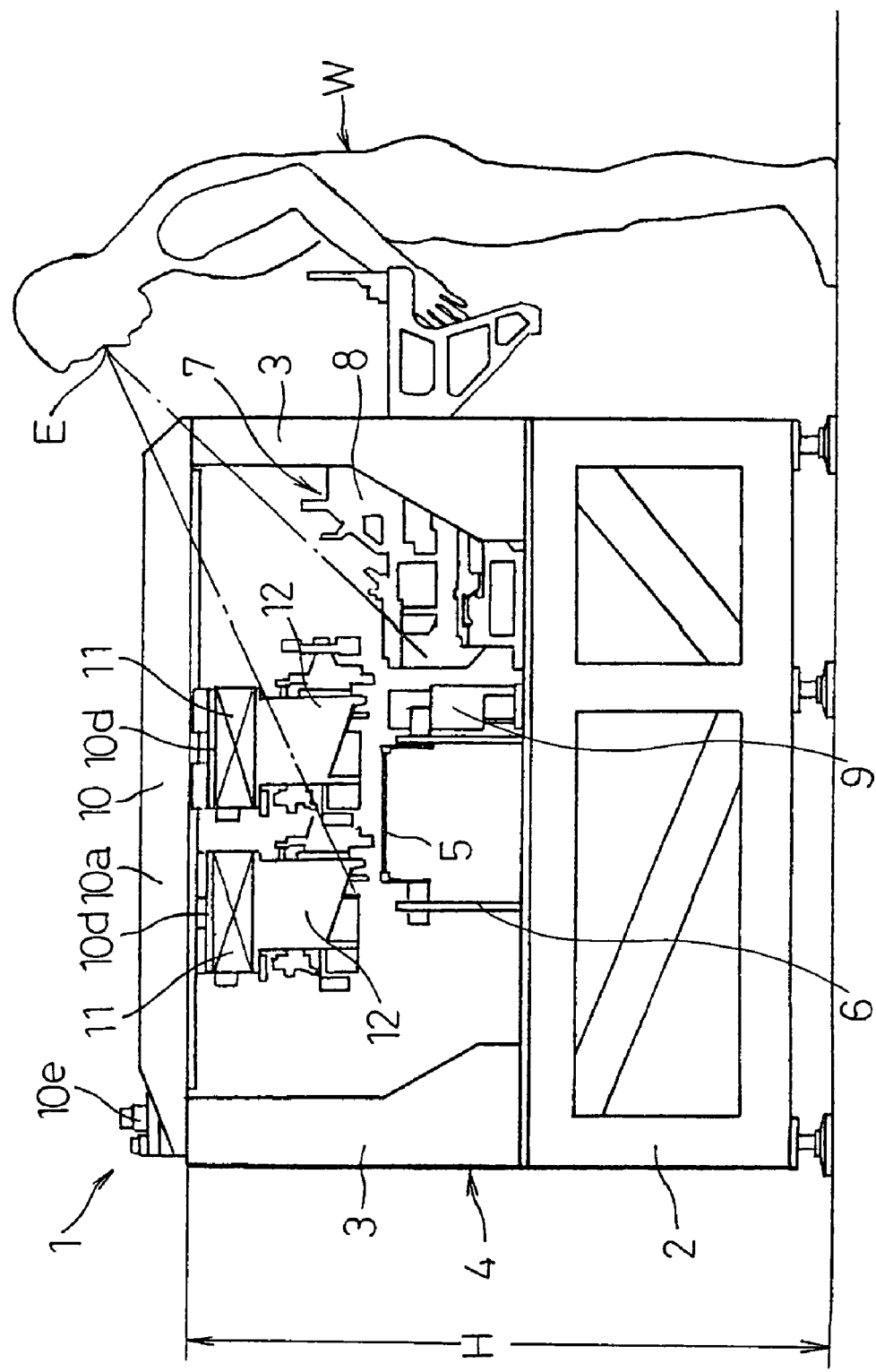
FIG. 1 is a side view of a component mounting apparatus according to an embodiment of the present invention.
Figure 2:
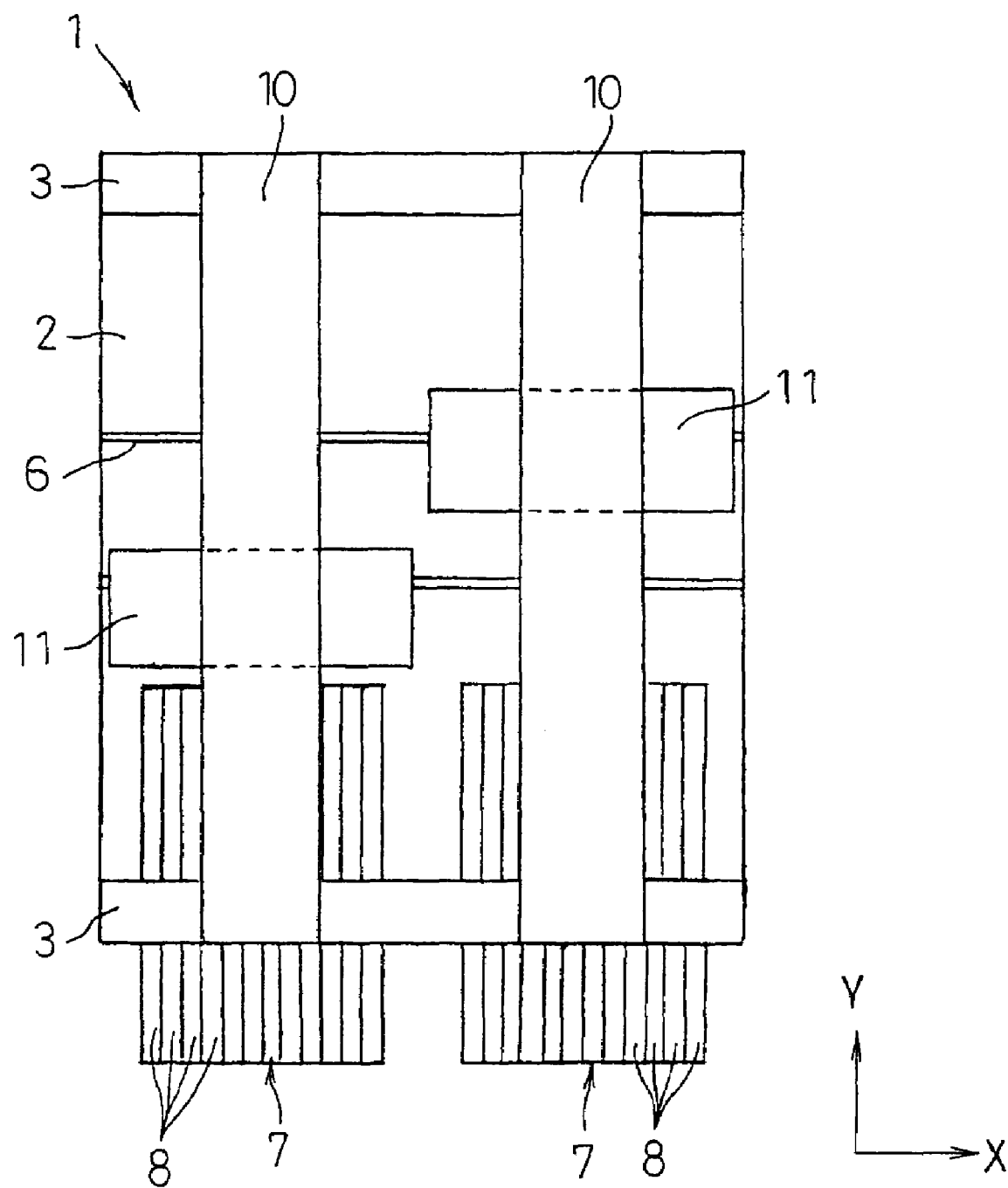
FIG. 2 is a plan view of the component mounting apparatus according to an embodiment of the present invention.
Figure 3:
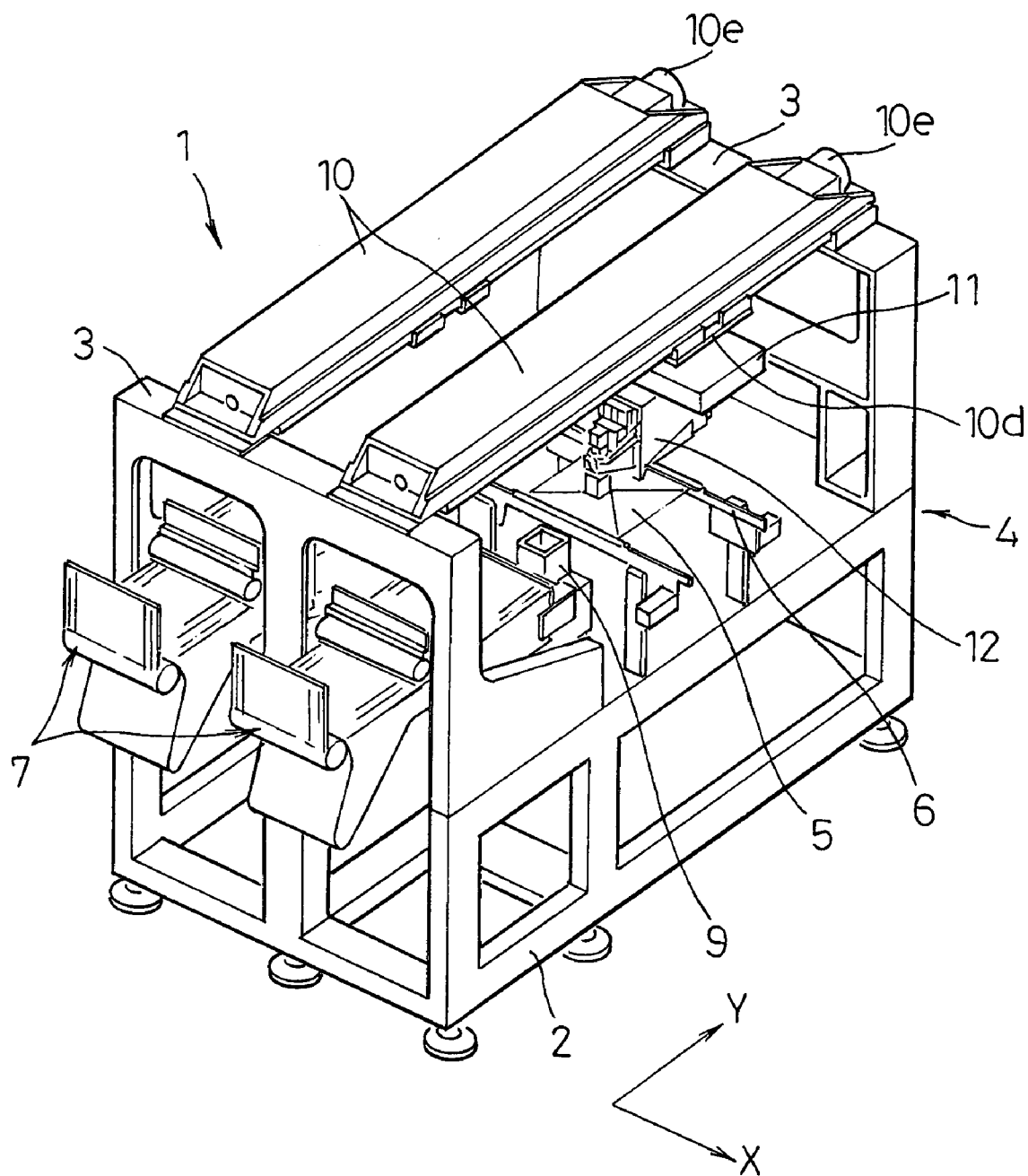
FIG. 3 is a perspective view of the component mounting apparatus according to an embodiment of the present invention.
Figure 4A:
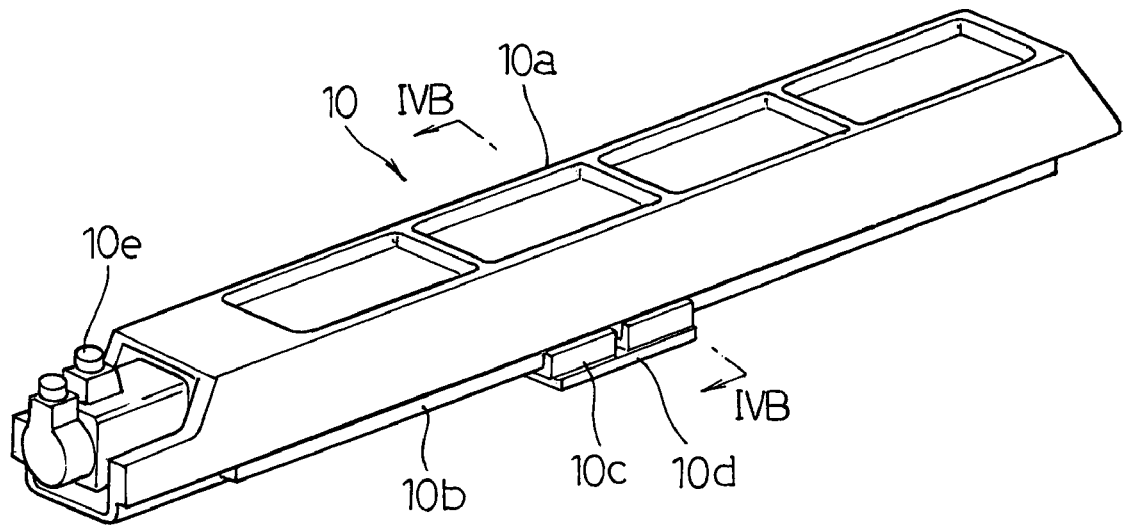
Figure 4B:
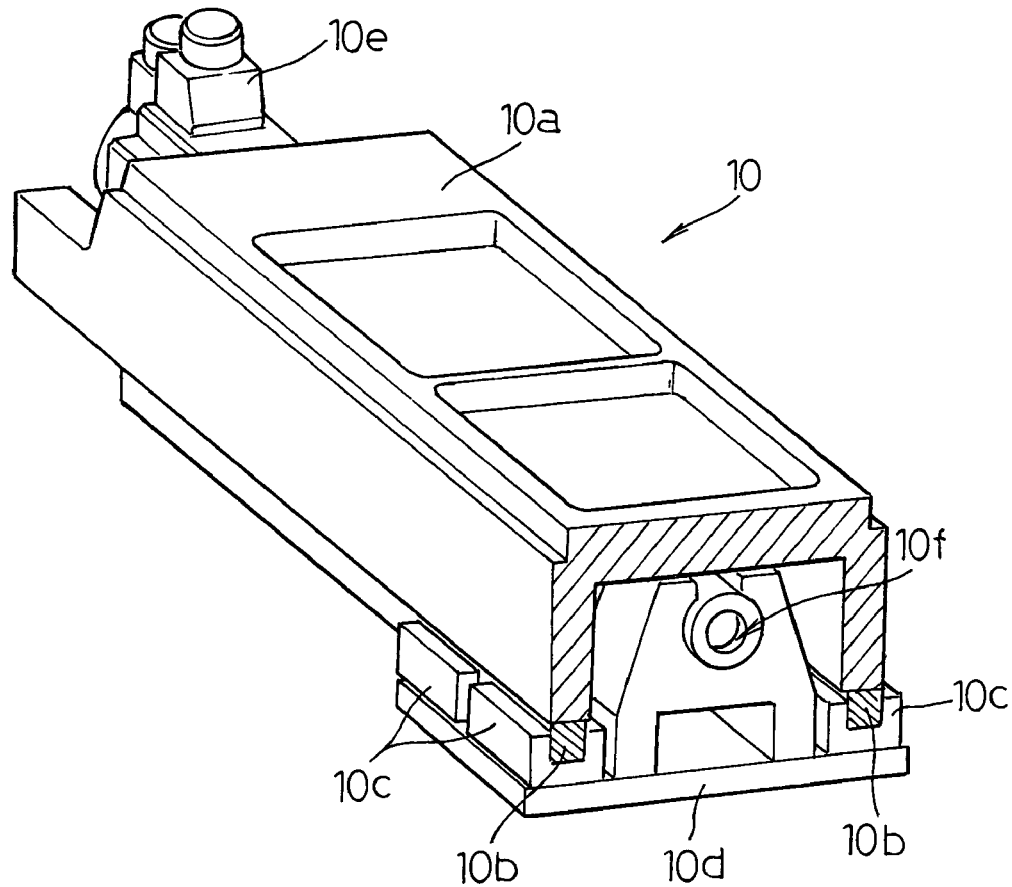

In FIG. 1 to FIG. 3 showing an overall configuration of a component mounting apparatus 1 of this embodiment, gate-shaped supporting frames 3 are arranged in a standing manner on both ends in a back-to-front direction (a Y direction) on a supporting base 2, and these supporting base 2 and supporting frames 3 collectively constitute a housing 4 of the component mounting apparatus 1. The housing 4 is arranged such that a height H of upper ends of the supporting frames 3 is located below a height of eyes E of a worker W. For example, the height of eyes E is assumed to be about 1550 mm high from a floor and the height H from the floor to the upper ends of the supporting frames 3 is set in the range from 1250 to 1350 mm. In other words, if the height H is set too low, a position for a mounting position becomes too low and workability is degraded when the worker W performs various operations. On the contrary, when the height H is set high, it is difficult for a short worker W to visually confirm a mounting condition. Accordingly, the above-mentioned scale is deemed appropriate.

In an approximately central portion in the back-to-front direction (the Y direction) on the supporting base 2, there is arranged a substrate conveyor-positioner unit (a work conveyor-positioner unit) 6 which is configured to convey and position a substrate (a work) 5 for mounting a component thereon in a left-to-right direction (an X direction). Moreover, a right and left pair of component supplying units 7 is arranged on a front end side on the supporting base 2. Each of the component supplying units 7 loads a plurality (which are twelve pieces in the illustrated example) of component supply cassettes 8 in parallel. The respective component supply cassettes 8 are configured to house numerous components and to serially supply the components to predetermined component supply positions. Note that a tray feeder configured to supply trays housing the components may be disposed in the component supplying unit 7 instead of the component supply cassettes 8. Meanwhile, on a side part of the component supplying unit 7 beside the substrate conveyor-positioner unit 6, there is arranged a component identifier 9 for identifying the component which is picked out of the component supplying unit 7.

A pair of Y-axis tables 10 and 10 is provided between the upper ends of the supporting frames 3 and 3 on the both ends in the front and back of the supporting base 2. As shown in detail in FIG. 4A and FIG. 4B, the Y-axis table 10 includes a rigid beam-shaped body 10a having a cross section of a low gate shape. A movable portion 10d is movably supported on guide rails 10b arranged on lower ends on both sides of the body frame 10a through linear guide members 10c. Moreover, the Y-axis table 10 is configured to move and position the movable portion 10d by use of a lead screw mechanism 10f which is operated by a drive motor 10e.

Figure 5:
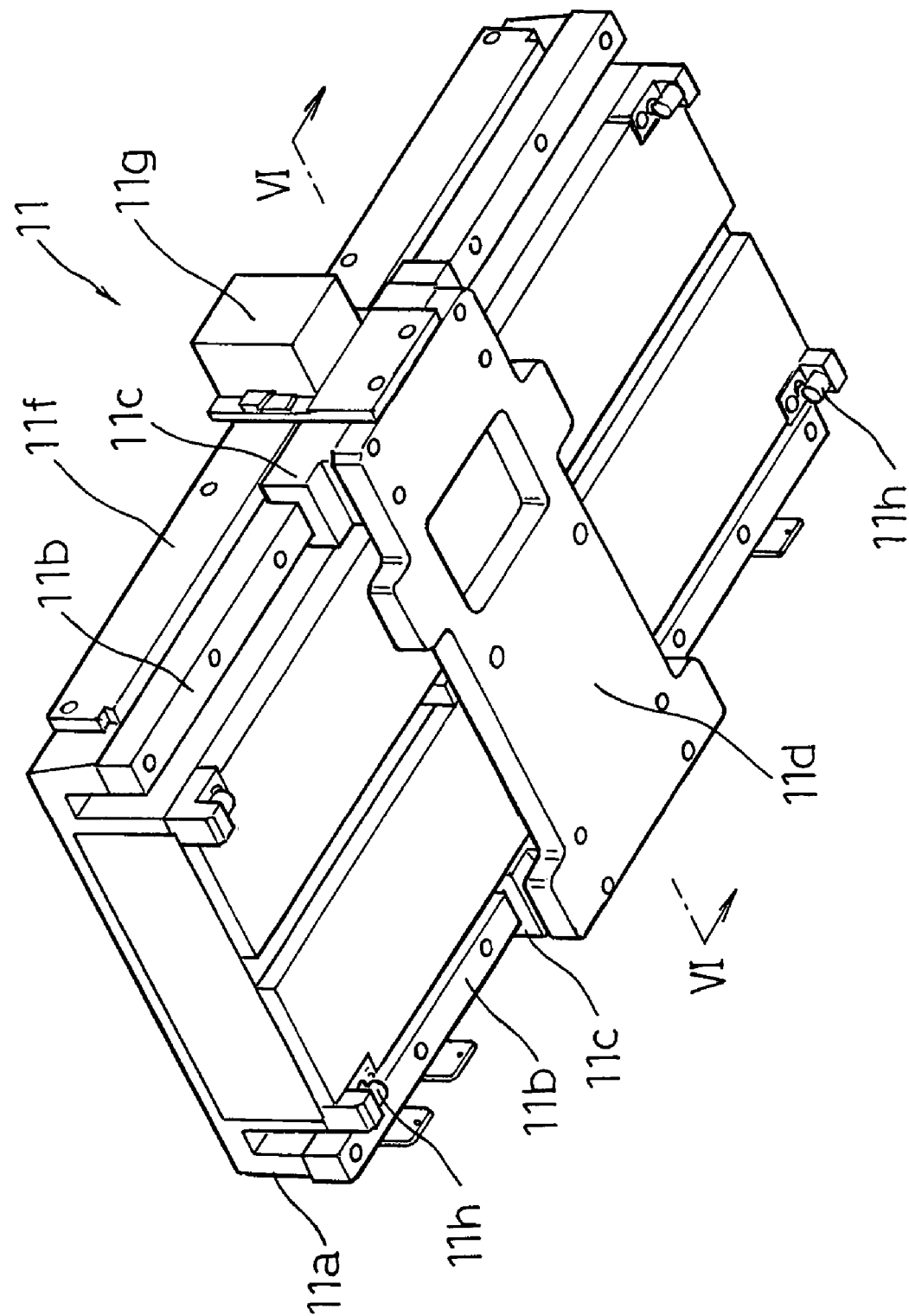
FIG. 5 is an overall perspective view of an X-axis table of the component mounting apparatus according to an embodiment of the present invention viewed obliquely from below.
Figure 6:
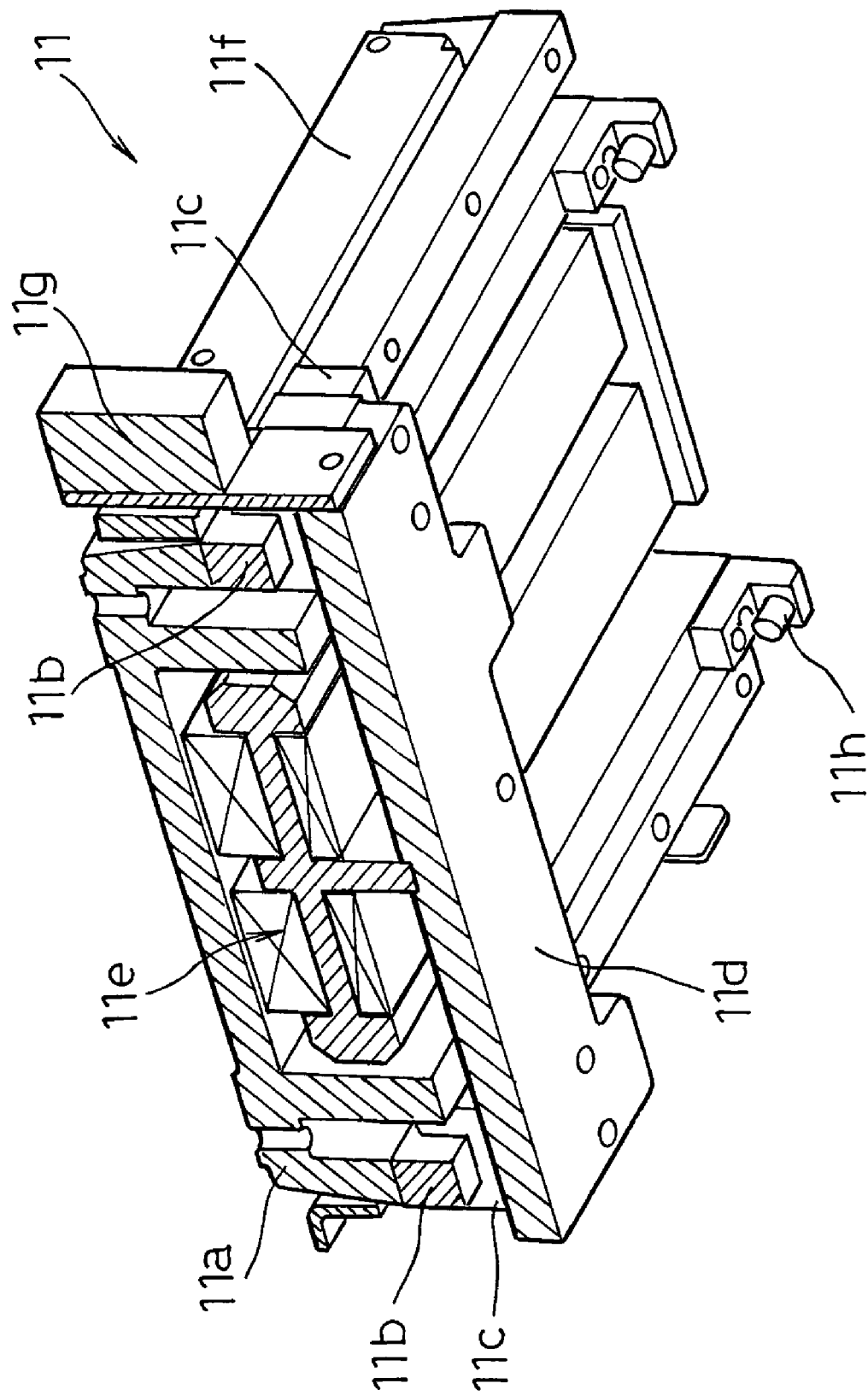
FIG. 6 is a perspective view of the X-axis table of the component mounting apparatus according to an embodiment of the present invention with a cross section taken along the VI-VI line in FIG. 5.

A central portion of an X-axis table 11 is attached and fixed to a lower surface of the movable portion 10d of the Y-axis table 10. Accordingly, an arrangement interval between the pair of Y-axis tables 10 and 10 is set to an interval slightly longer than a length of the X-axis table 11. As shown in FIG. 5 and FIG. 6, the X-axis table 11 includes a rigid beam-shaped body frame 11a having a cross section of a flat gate shape. A movable portion 11d is movably supported on guide rails 11b arranged on lower ends on both sides of the body frame 11a through linear guide members 11c. Moreover, the X-axis table 11 is configured to move and position the movable portion 11d by use of a linear motor 11e housed in an inner space of the body frame 11a above a traveling path of the movable portion 11d. The position of the movable portion 11d is detected by reading a linear scale 11f fixed to one side face of the body frame 11a with a reader 11g fitted to one side of the movable portion 11d. Moreover, stoppers 11h for defining moving ends of the movable portion 11d are provided on both sides in the vicinities of both ends of the body frame 11a.

Figure 7:
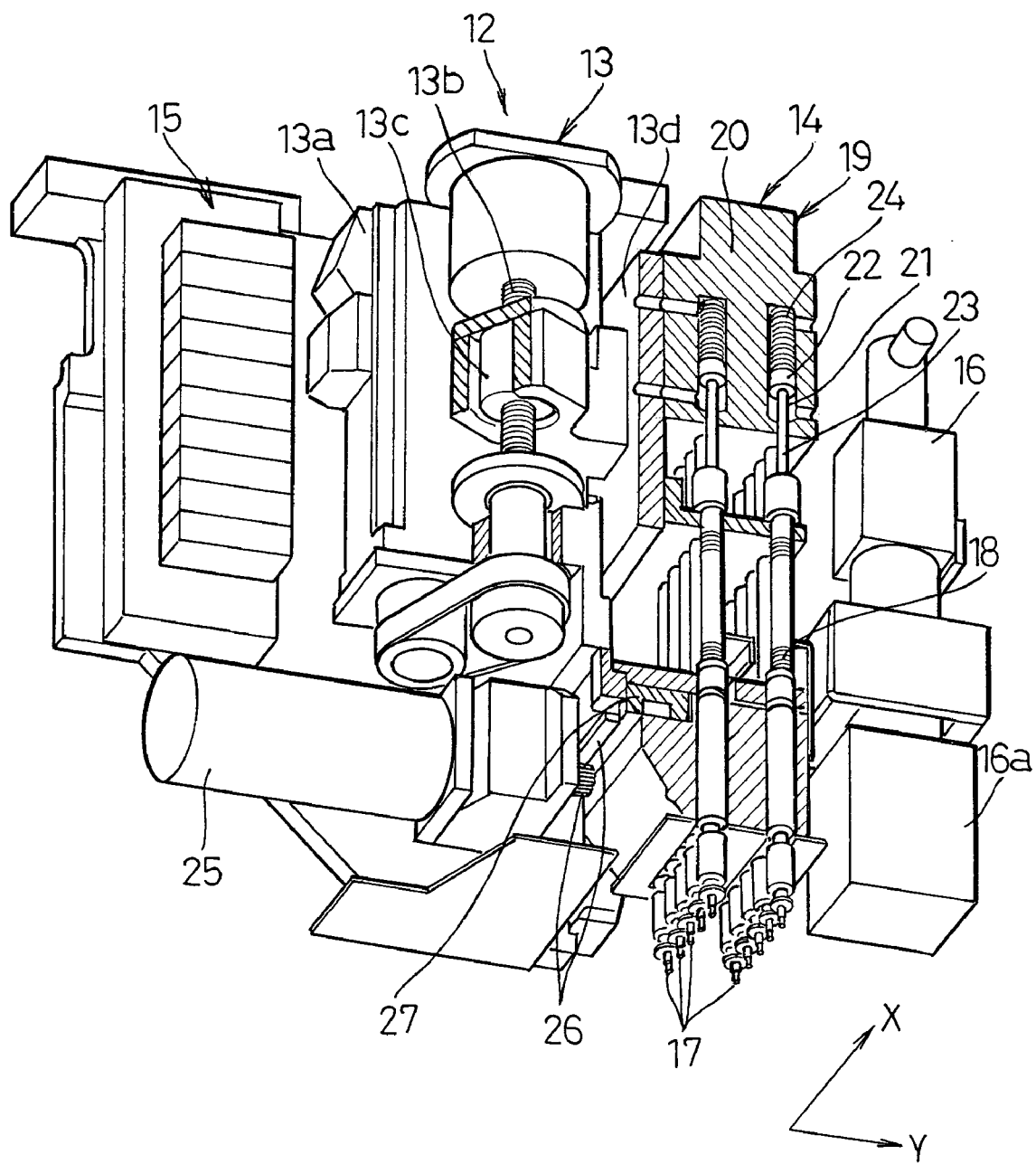
FIG. 7 is a perspective view of a mounting head of the component mounting apparatus according to an embodiment of the present invention viewed obliquely from below and provided with a partial cross section.

A mounting head (an operating head) 12 which is configured to hold a component at the component supplying unit 7 and to mount the component on the substrate 5 is attached to a lower surface of the movable portion 11d of the X-axis table 11. As shown in FIG. 7, the mounting head 12 includes an elevating mechanism 13 in a position immediately below the movable portion of the X-axis table. A nozzle unit 14 for attaching components by suction is arranged on one side in the Y direction (beside the component supplying unit 7) of the elevating mechanism 13. Meanwhile, a drive control unit 15 for the elevating mechanism 13 and the nozzle unit 14 is arranged on the other side in the Y direction of the elevating mechanism 13. Moreover, a substrate identifier 16 and a lighting device 16a thereof are attached to one side part of the nozzle unit 14.

The elevating mechanism 13 includes a lead screw mechanism composed of a ball screw 13b rotated by a drive motor 13a, and a nut member 13c to be engaged therewith. An elevating portion 13d is joined to the nut member 13c.

Five nozzles 17 are arrayed in parallel to the X direction and two sets of the nozzle arrays are arranged in the Y direction in the nozzle unit 14. Each of the ten nozzles 17 in total is supported movably in the vertical direction, and is energized by a spring 18 at an upper moving end so as to be movable downward. Moreover, on an upper part of the group of nozzles 17, there is arranged a selection mechanism 19 which is connected to the elevating portion 13d of the elevating mechanism 13 to be elevated together and is configured to selectively transmit such downward movement to each of the nozzles 17.

This selection mechanism 19 includes a cylinder block 20 provided with ten cylinder chambers 21 corresponding to the respective nozzles 17. A pushing shaft 23 engaged with an upper end of the nozzle 17 extends out of a piston 22 arranged inside the cylinder chamber 21, and a spring 24 is provided for energizing the piston 22 to move downward. Accordingly, when compressed air is introduced to an upper part of the cylinder chamber 21 corresponding to the nozzle 17 subject to downward movement in association with the downward movement of the elevating mechanism 13, the nozzle 17 is pushed downward together with the cylinder block 20 through the piston 22 and the pushing shaft 23. Meanwhile, the rest of nozzles 17 remain held at the upper moving ends by energizing force provided by the springs 18 as the pistons 22 move upward inside the corresponding cylinder chambers 21. In this way, the selection mechanism 19 is configured to select the desired nozzle 17 to be operated. Arrangement intervals of the respective nozzles 17 are set so as to correspond to parallel intervals of the component supply cassettes 8 in the component supplying unit 7, so that the nozzles 17 attach a plurality of components by suction at a time.

Here, in FIG. 7, reference numeral 25 is a θ-axis drive motor for correcting a rotational position of the nozzle 17 around the shaft center, which is configured to adjust the rotational position of each of the nozzles 17 through a rack-and-pinion mechanism 26 and a slider lever mechanism 27 (details of the mechanisms are omitted).

According to the component mounting apparatus 1 of the above-described configuration, the single component mounting apparatus 1 performs an operation of mounting components by use of the plurality of mounting heads 12 in which the respective mounting heads 12 are moved and positioned independently by the Y-axis tables 10 and the X-axis tables 11. Therefore, it is possible to dramatically enhance the mounting efficiency of components. Moreover, since the component mounting apparatus 1 is not designed to provide the plurality of mounting heads 12 on a single table, each of the respective mounting heads 12 is mutually insensitive to vibrations and the like associated with the mounting operation by the other mounting heads 12. In this way, it is possible to ensure the mounting accuracy.

In addition, the nozzle unit 14 of the mounting head 12 in the illustrated example includes ten nozzles 17 in total, which are composed of five nozzles 17 arrayed in parallel to the X direction and two sets of the nozzle arrays arranged in the Y direction as well. Accordingly, the mounting head 12 holds ten components at the maximum in one cycle of moving the mounting head 12 to the component supplying unit 7. Accordingly, it is possible to further enhance the mounting efficiency.

Moreover, although the component mounting apparatus 1 includes the plurality of mounting heads 12 as described above, the component mounting apparatus 1 is configured to arrange the Y-axis tables 10 in parallel in the right-to-left direction (the X direction), which is the direction of conveying the substrate, and thereby to lay the Y-axis tables 10 between the supporting frames 3 and 3 arranged in a standing manner on the both ends in the back-to-front direction. In this way, it is possible to configure the component mounting apparatus 1 with a compact outside dimension in the X direction, and to dramatically reduce equipment costs for a mount line. In addition, although the component mounting apparatus 1 includes the plurality of mounting heads 12 as described above, the height H of the upper ends of the supporting frames 3 are set lower than the height of eyes E of a worker W. Accordingly, it is possible to visually confirm operating conditions of the mounting heads 12 on both the sides from above through the interval between the Y-axis tables 10 and 10. Accordingly, it is possible to confirm the operating conditions easily and workability during maintenance and checkups is thereby enhanced. In addition, since the overall height dimension is set below the height of eyes E of a worker W, rigidity of the housing 4 is enhanced in accordance with reduction in the height dimensions of the supporting base 2 and the supporting frames 3. Accordingly, it is possible to enhance mounting accuracy.

Moreover, the movable portion 10d is provided to the lower surface of the Y-axis table 10 and the central portion of the X-axis table 11 is attached to the movable portion 10d. Meanwhile, the movable portion 11d is provided to the lower surface of this X-axis table 11 and the mounting head 12 is attached to the lower surface of the movable portion 11d. In this way, the mounting head 12 is supported in a suspended style from the Y-axis table 10 and the X-axis table 11. Accordingly, it is possible to achieve a compact configuration while gaining high support rigidity of the mounting head 12. Moreover, since the X-axis table 11 is supported at the central portion, it is possible to increase the supporting rigidity when the mounting head 12 moves between the both ends of the X-axis table 11, and to secure a sufficient space for visual confirmation between the Y-axis tables 10 and 10.

In terms of demonstrate numerical examples, when the length of the X-axis table is about 450 mm, for instance, it is possible to reduce the outside dimension in the X direction of the component mounting apparatus 1 to about 900 mm. Meanwhile, when a width dimension of the Y-axis table 10 is about 200 mm, it is possible to visually confirm the operating conditions of the mounting heads 12 on the both sides from above through an interval of about 250 mm between the Y-axis tables 10 and 10.

Moreover, in this embodiment, the X-axis table 11 is configured to movably support the movable portion 11d with the guide rails 11b arranged on the lower ends on both sides of the body frame 11a having the flat cross-sectional dimension. Meanwhile, the linear motor 11e having a small vertical dimension which is housed in the inner space of the body frame 11a above the traveling path of the movable portion 11d is configured to drive and position the movable portion 11d. Accordingly, it is possible to reduce the vertical dimension of the X-axis table 11, and it is thereby possible to raise the height of the mounting operation by the mounting head 12 as high as possible while lowering the height of the upper ends of the supporting frames 3. In this way, it is possible to ensure high workability.

Furthermore, the mounting head 12 includes the elevating mechanism 13 in the position immediately below the movable portion 11d of the X-axis table 11. Meanwhile, the nozzle unit 14 for attaching components by suction is disposed on a front side part of this elevating mechanism 13, and the drive control unit 15 for the elevating mechanism 13 and the nozzle unit 14 is arranged on a back side part of the elevating mechanism 13. Accordingly, it is possible to reduce the vertical dimension of the mounting head 12 in itself. Therefore, it is possible to raise the height of the mounting operation by the mounting head 12 as high as possible while lowering the height of the upper ends of the supporting frames 3. In this way, it is possible to ensure high workability.

In addition, since the nozzle unit 14 includes the selection mechanism 19 for selectively transmitting the elevating operation of the elevating mechanism 13 to a desired nozzle 17, it is possible to operate the desired nozzle 17 simply by elevating the selection mechanism 19 of the nozzle unit 14 with the elevating mechanism 13. In this way, it is possible to perform operations of holding and mounting necessary components efficiently with the simple and minimum configuration.

INDUSTRIAL APPLICABILITY

As described above, the component mounting apparatus according to the present invention includes the plurality of operating heads for performing operations and is therefore suitable for dramatically enhancing the operation efficiency. Moreover, the respective operating heads are configured to operate independently and are therefore mutually insensitive to vibrations and the like associated with the operations thereof. Accordingly, the component mounting apparatus of the present invention is also suitable for ensuring the operation accuracy. Furthermore, while the component mounting apparatus includes the plurality of operating heads, the Y-axis tables are laid between the supporting frames which are arranged in a standing manner on the both ends in the Y direction of the supporting base in parallel to the X direction along the direction of conveying the work. Accordingly, the component mounting apparatus of the present invention is suitable for relatively reducing the outside dimension in the X direction of the component mounting apparatus to achieve a compact configuration. In addition, the component mounting apparatus of the present invention is also suitable for dramatically reducing equipment costs for a work line.

The invention claimed is:

1. A component mounting apparatus comprising:
a work conveyor-positioner unit arranged on a supporting base to convey and position a substrate in an X direction;
supporting frames extending vertically from ends of the supporting base and facing each other in a Y direction;
a plurality of Y-axis tables extending between upper ends of the supporting frames;
X-axis tables attached to movable portions of the Y-axis tables; and
operating heads attached to movable portions of the X-axis tables to perform operations with respect to the substrate on the work conveyor-positioner unit,
wherein each of the plurality of the Y-axis tables includes a movable portion at a lower part thereof, each of the X-axis tables includes a movable portion at a lower part thereof, and the operating heads are attached to a lower part of the movable portion of the X-axis tables.

2. The component mounting apparatus according to claim 1, wherein a central portion of each of the X-axis tables is attached to the movable portion of each of the plurality of the Y-axis tables, and the spacing between the plurality of Y-axis tables is set slightly larger than a length of one of the X-axis tables.

3. The component mounting apparatus according to claim 1, wherein each of the X-axis tables includes guide portions provided on both sides thereof to movably support the movable portion arranged at the lower part thereof, and a linear motor provided on an upper side of a traveling path of the movable portion and between the guide portions on the both sides to drive and position the movable portion.

4. The component mounting apparatus according to claim 1, wherein a component supplying unit is arranged on one side or both sides in the Y direction on the supporting base, each of the operating heads includes an elevating mechanism positioned below the movable portion of each of the X-axis tables, and a nozzle unit having a plurality of nozzles to attach components by suction to the substrate at the component supplying unit, wherein the nozzle unit is disposed beside the elevating mechanism.

5. The component mounting apparatus according to claim 4, wherein the plurality of nozzles are configured to simultaneously perform attachment by suction at the component supplying unit.

6. The component mounting apparatus according to claim 5, wherein the nozzle unit includes a selection mechanism to selectively transmit an elevating operation of the elevating mechanism to a desired nozzle.

* * * * *